United States Patent
Dai et al.

[11] Patent Number: 6,045,954
[45] Date of Patent: Apr. 4, 2000

[54] FORMATION OF SILICON NITRIDE FILM FOR A PHASE SHIFT MASK AT 193 NM

[75] Inventors: Chang-Ming Dai, Hsinchu; Lon A. Wang; H.L. Chen, both of Taipei, all of Taiwan

[73] Assignee: Industrial Technology Research Institute, Hsin-Chu, Taiwan

[21] Appl. No.: 09/097,145

[22] Filed: Jun. 12, 1998

[51] Int. Cl.$^7$ ...................................................... G03F 9/00
[52] U.S. Cl. ................................................................ 430/5
[58] Field of Search ........................ 430/5, 322; 427/585, 427/582, 590, 588

[56] References Cited

U.S. PATENT DOCUMENTS

| | | | |
|---|---|---|---|
| 4,863,755 | 9/1989 | Hess et al. .............................. | 427/39 |
| 4,972,061 | 11/1990 | Duley et al. ...................... | 219/121.66 |
| 5,015,353 | 5/1991 | Hubler et al. ...................... | 204/192.31 |
| 5,468,978 | 11/1995 | Dowben .................................. | 257/258 |
| 5,902,702 | 5/1999 | Nakao et al. .............................. | 430/5 |

OTHER PUBLICATIONS

B.W. Smith et al, "The Effects of Excimer Laser Radiation on a Henvated Phase Shift Masking Materials" SPIE, 1997, vol. 3051, p. 236–244.

*Primary Examiner*—S. Rosasco
*Attorney, Agent, or Firm*—George O. Saile; Stephen B. Ackerman

[57] ABSTRACT

A half tone phase shift mask material, suitable for use at 193 nm is disclosed. It comprises a layer of nitrogen rich silicon nitride that was formed by subjecting a mixture of a nitrogen bearing gas, such as nitrogen and/or ammonia, with a silicon bearing gas, such as silane, to a plasma discharge. Provided the ratio of the nitrogen bearing to the silicon bearing gases is about 10 to 1, films having the required optical properties at 193 nm are formed. These properties are a reflectance that is less than 15% and a transmittance that is between 4 and 15%. Related optical properties, namely an extinction coefficient of about 0.4 and a refractive index of about 2.5, are also closely approached. Additionally, the films are stable under prolonged UV exposure and exhibit good etch behavior.

7 Claims, 3 Drawing Sheets

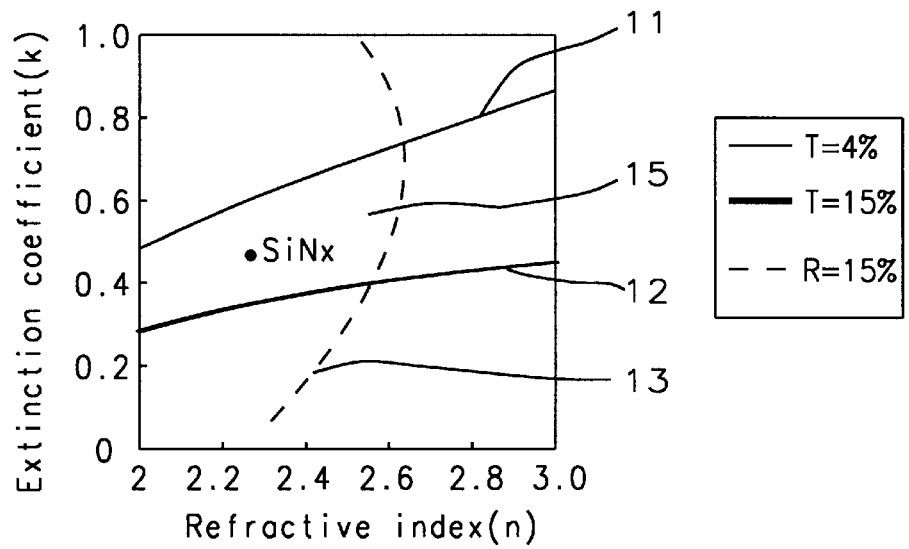
*FIG. 1 - Prior Art*
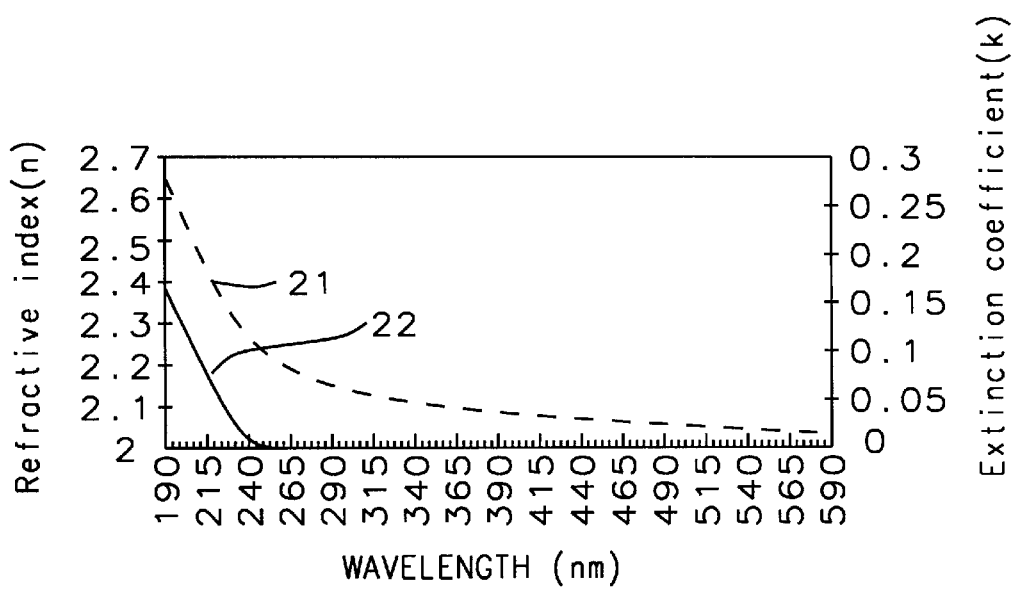
*FIG. 2 - Prior Art*

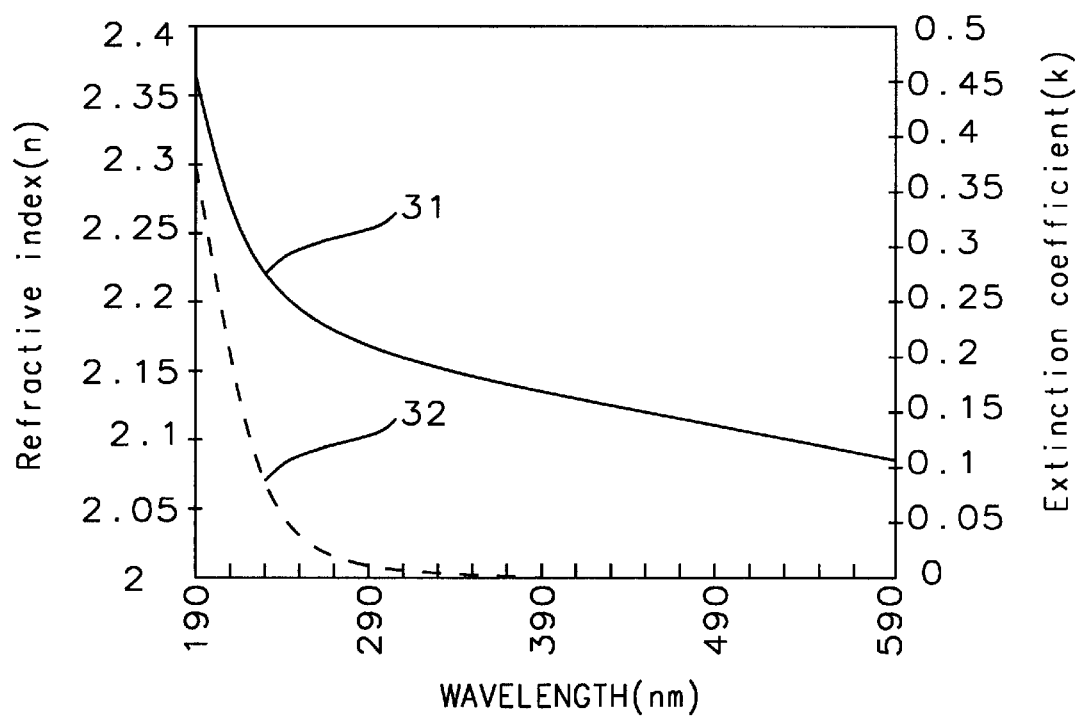
FIG. 3 – Prior Art
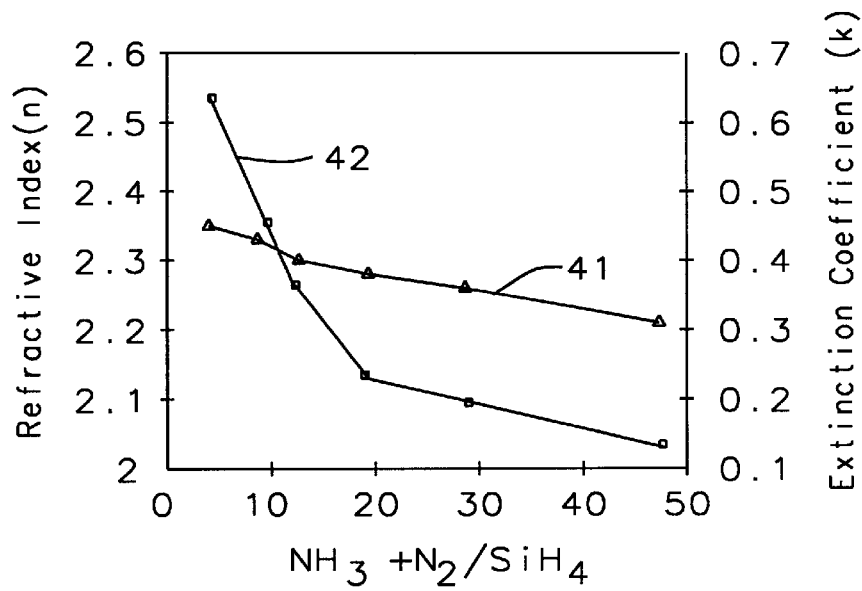
FIG. 4

FORMATION OF SILICON NITRIDE FILM FOR A PHASE SHIFT MASK AT 193 NM

FIELD OF THE INVENTION

The invention relates to phase shift mask material suitable for use at 193 nm and to methods for manufacturing same.

BACKGROUND OF THE INVENTION

As the dimensions within integrated circuits continue to shrink, the resolution limit of the radiation used to expose photoresist continues to be the final barrier to shrinking dimensions even further. The introduction of the phase shift mask has allowed this barrier to be pushed towards smaller and smaller features. The principle on which a phase shift mask operates is to bring about the destructive interference of the diffraction fringes normally found at the edge of an image, thereby improving image contrast.

For lithography at 365 nm (i-line) and 248 nm (for example from a KrF laser) the attenuated phase shifting mask (APSM) has been widely used because of its ease of design and fabrication. A wide range of materials suitable for use as APSMs are available, including silicon oxide, chromium oxide, silicon nitride, silicon carbo nitride, and molybdenum silicon oxynitride. Application is usually focussed on contact layers due to alleviation of defect problems in dark field masks. It can push the resolution of contact printing one generation ahead since aerial image contrast is enhanced.

When, however, the wavelength of the resist exposure radiation is reduced still further to 193 nm (ArF laser), the materials listed above are no longer adequate and at least one replacement must be found if efficient phase shift masks for use at 193 nm are to be developed. This is because the refractive index (n) and the extinction coefficient are both functions of wavelength.

The two key optical properties that must be possessed by a material if it is to be suitable for use as a phase shift mask at 193 nm are that its transmittance (at a thickness corresponding to a 180 degree phase shift) must be between about 4 and 15% while its reflectance must be about 15%. These properties, in turn, depend on the refractive index and extinction coefficient of the material in question (at 193 nm).

Referring now to FIG. 1, we show three curves, measured at 193 nm, of extinction coefficient (attenuation of transmitted radiation due to both absorption and scattering) as a function of refractive index. Curve 11 is for a transmittance of 4% (corresponding to a relatively thick film), curve 12 is for a transmittance of 15% (corresponding to a relatively thin film), and curve 13 is for a reflectance of 15% (independent of thickness).

Thus for a material to be suitable for use as a phase shift mask at 193 nm its optical properties must be such that it is located within the area marked as 15 in FIG. 1, as close to line 13 as possible. Thus, one set of optimal properties would be an extinction coefficient of about 0.4 and a refractive index of about 2.5.

The point marked as SiNx in FIG. 1 indicates where non-stoichiometric silicon nitride (having the desired properties) falls on this plot. It is clear from this that non-stoichiometric silicon nitride is what is needed for a 193 nm APSM. This conclusion is confirmed by the data shown in FIG. 2 which is for stoichiometric silicon nitride. As can be seen, at 193 nm, the refractive index is 2.65 (curve 21) while the extinction coefficient is about 0.17.

We refer now to FIG. 3 which is similar to FIG. 2 in that curves of refractive index and extinction coefficient, as a function of wavelength, for silicon nitride are also plotted. These samples were deposited by means of sputtering and have been reported by B. W. Smith et al. in SPIE 1997, vol. 3051, pp. 236–244. In the course of transferring silicon nitride from a target to a substrate, some of the nitrogen was lost so the films ended up as silicon rich. The effects of this departure from stoichiometry are reflected in the values for refractive index and extinction coefficient at 193 nm. These were about 2.37 and 0.38, respectively, much closer to the ideal values of 2.5 and 0.4 than could be achieved with non-stoichiometric films.

While these optical values for silicon rich films are attractive, other properties of the silicon rich films, such as UV stability and etch characteristics, make them unattractive for use within an integrated circuit manufacturing process. Other attempts to modify the optical properties of silicon nitride by varying the silicon/nitrogen ratio have also been reported but it has turned out that silicon rich silicon nitride is much easier to form than a nitrogen rich version. For example, Hess et al. (U.S. Pat. No. 4,863,755 September 1989) show how PECVD may be used to generate silicon nitride films. They use an organic silicon/nitrogen source in conjunction with hydrogen or ammonia. Some control of stoichiometry is achieved by varying process conditions but the films also include significant quantities of carbon and oxygen.

Hubler et al. (U.S. Pat. No. 5,015,353 May 1991) teach how films of composition $Si_{1-x}N_x$, where x is controlled to be between 0 and 0.57, can be formed. Thus any departure from stoichiometry that they achieved was always on the side of being silicon rich.

Dowben (U.S. Pat. No. 5,468,978 November 1995) also teaches that the stoichiometry of films produced by PECVD may be controlled by varying concentration of precursor materials and other process parameters. However the material produced was boron carbide so a direct comparison with silicon nitride is not possible.

SUMMARY OF THE INVENTION

It has been an object of the present invention to provide a half tone phase shift mask material suitable for use at 193 nm.

Another object of the invention has been to provide a process for manufacturing said material.

A further object of the invention has been to provide a process for forming a silicon nitride film that is nitrogen rich.

These objects have been achieved by subjecting a mixture of a nitrogen bearing gas, such as nitrogen and/or ammonia, with a silicon bearing gas, such as silane, to a plasma discharge thereby causing the deposition of silicon nitride films. Provided the ratio of the nitrogen bearing to the silicon bearing gases is about 10 to 1, films having the required optical properties at 193 nm are formed. These properties are a reflectance that is less than 15% and a transmittance that is between 4 and 15%. Related optical properties, namely an extinction coefficient of about 0.4 and a refractive index of about 2.5, are also closely approached. Additionally, the films are stable under prolonged UV exposure and have good etch behavior.

BRIEF DESCRIPTION OF THE DRAWINGS

FIG. 1 is a plot of extinction coefficient vs. refractive index for certain values of reflectance and transmittance.

FIG. 2 is a plot of refractive index and extinction coefficient as a function of wavelength, for a layer of stoichiometric silicon nitride at 193 xnm.

FIG. 3 is similar to FIG. 2 but is for silicon nitride that is under-stoichiometric.

FIGS. 4 and 5 plot refractive index and extinction coefficient as a function of the ratio between the nitrogen bearing and silicon bearing gases used in the PECVD.

DESCRIPTION OF THE PREFERRED EMBODIMENTS

Figure 5:
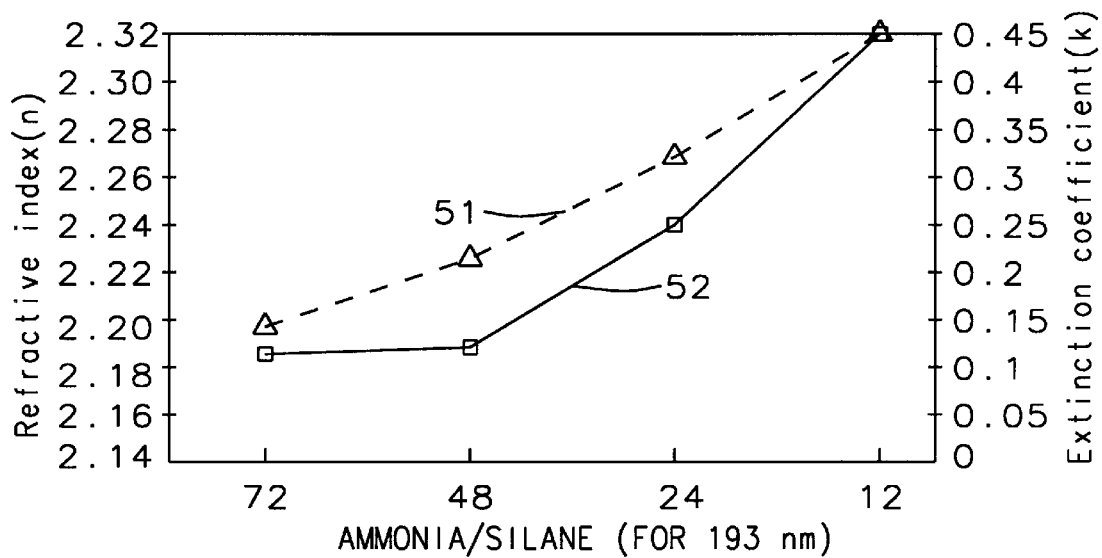

The present invention discloses how nitrogen rich films of silicon nitride may be formed. The method used for depositing the films is Plasma Enhanced Chemical Vapor Deposition (PECVD). As discussed above, the use of conventional PECVD or other known deposition techniques leads to films that are silicon rich. In the present invention it is shown that, if key process parameters are confined to certain critical ranges, good quality nitrogen rich silicon nitride can be obtained.

The process of the present invention begins with the admission of gaseous compounds containing nitrogen and silicon into a reaction chamber. Typically, the nitrogen component has been a mixture of nitrogen and ammonia while the silicon component has been silane, but it will be understood that other nitrogen and silicon bearing gases could be substituted without departing from the spirit of the invention.

Following standard practice, the pressure of the gases in the chamber is controlled by establishing a dynamic equilibrium between a pumping system that continuously removes gases from the chamber, and flow valves that continuously admit gases into it. Once the pressure has been stabilised (at between about $10^{-3}$ and $10^{-1}$ torr) a plasma discharge (at a power level between about 90 and 120 watts) is set up in the gas. This enhances the CVD process whereby a layer of silicon nitride deposits on a suitable substrate within the chamber. Typically, the substrate would be a silicon wafer which bears a partially completed integrated circuit. Substrate temperature is generally between about 250 and 300° C.

Deposition of the silicon nitride film is allowed to continue until it reaches a thickness that would cause a 180 degree phase shift in a beam of 193 nm radiation passing through it. This thickness is between about 720 and 750 Angstroms and, once it has been reached, the process is terminated.

Key to the ability of the above described process to yield nitrogen rich silicon nitride films having the required optical and other properties is the control of certain key parameters, notably the relative flow rates of the nitrogen, ammonia and silane gases:

For a given mix of ammonia and nitrogen, the flow rate of the mix relative to the flow rate of the silane should be between about 10 and 12 to 1. Within the mix, the flow rate of the nitrogen relative to the ammonia should be between about 0.9 and 1.1 to 1. This is equivalent to a nitrogen:ammonia:silane flow rate ratio of between about 4.5 to 6.6:4.5 to 6.6:0.9 to 1.1.

In more limited terms, relating to specific flow rates, if the nitrogen is admitted at a flow rate between about 45 and 70 SCCM, the ammonia must be admitted at a flow rate between about 40 and 70 SCCM, and the silane must be admitted at a flow rate between about 9 and 11 SCCM.

If the above process guide-lines are strictly observed, the resulting films will be nitrogen rich in that the atomic concentration of nitrogen will exceed the stoichiometric value of 0.57 by between about 57 and 60%.

In FIG. 4 we illustrate the influence of the ammonia/nitrogen to silane ratio on the refractive index and extinction coefficient of the films. Curve 42 is for the extinction coefficient and a ratio of about 10:1 is seen to be optimum for achieving the ideal of 0.4 as already noted. Curve 41 is for the refractive index. At the 10:1 ratio this curve is seen to be almost flat and corresponding to a value of about 2.3. The nitrogen fraction was 0.04 and the measurements were made at 193 nm.

In FIG. 5 we display the results of a process using pure ammonia and silane. The influence of the ammonia to silane ratio on the refractive index and extinction coefficient of the films has been measured at 193 nm. Curve 52 is for the extinction coefficient and a ratio of about 12:1 is seen to be optimum for achieving the ideal of 0.4 as already noted. Curve 51 is for the refractive index. At the 12:1 ratio its value is about 2.32.

Figure 6:
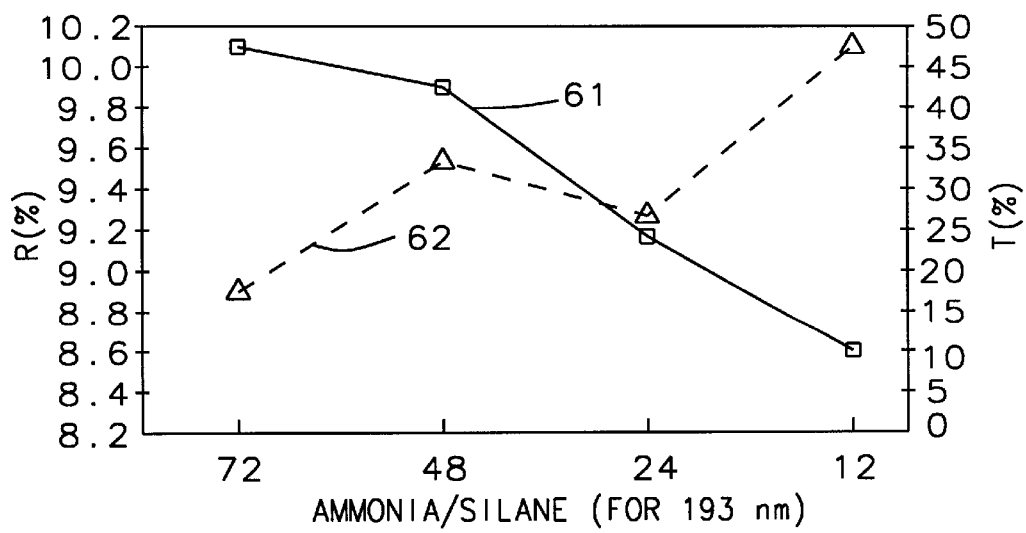
FIG. 6 plots reflectance and transmittance as functions of the ammonia to silane ratio during PECVD.

In FIG. 6 the same data seen in FIG. 5 is shown in terms of reflectance and transmittance, also measured at 193 nm. Curve 61 is for the transmittance and a ratio of about 12:1 is seen to correspond to a transmittance of about 10% (which is between 4 and 15%). Curve 62 is for the reflectance and a ratio of about 12:1 is seen to correspond to a value of about 10%, (i.e. less than 15%.

Thus, silicon nitride films deposited according to the above guide-lines, namely an ammonia/nitrogen to silane ratio between about 10 and 12 to 1 or an ammonia to silane ratio between about 9 and 12 to 1, used as part of a PECVD process, will lead to silicon nitride films that are nitrogen rich and have transmittances between 4 and 15% and a reflectance that is less than 15%. Additionally, such films have been found to be stable under prolonged UV exposure and to exhibit good etch behaviour (providing an etch selectivity in excess of 6).

While the invention has been particularly shown and described with reference to the preferred embodiments thereof, it will be understood by those skilled in the art that various changes in form and details may be made without departing from the spirit and scope of the invention.

What is claimed is:

1. A process for the manufacture of a 193 nm half tone phase shift mask, comprising:

admitting gaseous compounds of nitrogen and silicon into a reaction chamber at a pressure;

initiating a plasma discharge within said gas thereby causing a layer of nitrogen rich silicon nitride to form, through plasma enhanced chemical vapor deposition, on a substrate; and when said layer has reached a thickness corresponding to a 180 degree phase shift for 193 nm radiation, terminating the process.

2. The process of claim 1 wherein the pressure is between about $10^{-2}$ and $10^{-1}$ torr.

3. The process of claim 1 wherein the plasma discharge is at a power level between about 90 and 100 watts.

4. The process of claim 1 wherein the substrate is at a temperature between about 250 and 300° C.

5. The process of claim 1 wherein the layer of silicon nitride has a reflectance less than about 15% at 193 nm.

6. The process of claim 1 wherein the layer of silicon nitride has a transmittance at 193 nm in the range of from about 4% to about 15%.

7. The process of claim 1 wherein said thickness is between about 1736 and 748 Angstroms.

* * * * *